(12) United States Patent
Chen

(10) Patent No.: US 6,785,870 B2
(45) Date of Patent: Aug. 31, 2004

(54) METHOD OF OPTIMIZING HIGH PERFORMANCE CMOS INTEGRATED CIRCUIT DESIGNS FOR POWER CONSUMPTION AND SPEED USING GLOBAL AND GREEDY OPTIMIZATIONS IN COMBINATION

(75) Inventor: Thomas W Chen, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 313 days.

(21) Appl. No.: 10/098,110

(22) Filed: Mar. 14, 2002

(65) Prior Publication Data

US 2003/0177452 A1 Sep. 18, 2003

(51) Int. Cl.[7] .............................. G06F 17/50; G06F 9/45
(52) U.S. Cl. .................................... 716/2; 716/5; 716/7
(58) Field of Search ................................. 716/1–2, 4–8, 716/18; 706/13

(56) References Cited

U.S. PATENT DOCUMENTS

| | | | |
|---|---|---|---|
| 5,521,834 A | | 5/1996 | Crafts et al. |
| 5,557,533 A | * | 9/1996 | Koford et al. ................. 716/9 |
| 6,075,932 A | | 6/2000 | Khouja et al. |
| 6,360,191 B1 | * | 3/2002 | Koza et al. ..................... 716/2 |
| 6,574,783 B1 | * | 6/2003 | Zhuang et al. ................. 716/8 |
| 6,578,176 B1 | * | 6/2003 | Wang et al. .................. 706/13 |

* cited by examiner

Primary Examiner—Vuthe Siek
Assistant Examiner—Paul Dinh

(57) ABSTRACT

A method of optimizing speed and power consumption of an integrated circuit having at least one path having at least one gate involves creating a parent state representing a partition of the integrated circuit design. Each device in the parent state further has associated device size information and device type information. A population of individual states are created from at least one parent states. These individual states are scored for timing and power dissipation. Survivor individual states of the population are determined based upon scores of each state of the population. The steps of creating the population of individual states, scoring states, and determining survivor states, are iterated as needed. Survivor states are then further optimized with a greedy search, and a best individual survivor state is selected as an optimized state of each partition. The integrated circuit netlist is adjusted to correspond to the optimized state.

8 Claims, 5 Drawing Sheets

METHOD OF OPTIMIZING HIGH PERFORMANCE CMOS INTEGRATED CIRCUIT DESIGNS FOR POWER CONSUMPTION AND SPEED USING GLOBAL AND GREEDY OPTIMIZATIONS IN COMBINATION

RELATED APPLICATIONS

This application is related to co-filed applications for U.S. patent application Ser. No. 10/098111, filed Mar. 14, 2002, now U.S. Pat. No. 6,687,888 and entitled A METHOD OF OPTIMIZING HIGH PERFORMANCE CMOS INTEGRATED CIRCUIT DESIGNS FOR POWER CONSUMPTION AND SPEED; Ser. No. 10/098136, filed Mar. 14, 2002, now U.S. Pat. No. 6,711,720 and entitled A METHOD OF OPTIMIZING HIGH PERFORMANCE CMOS INTEGRATED CIRCUIT DESIGNS FOR POWER CONSUMPTION AND SPEED THROUGH GENETIC OPTIMIZATION; Ser. No. 10/098112, filed Mar. 14, 2002, now U.S. Pat. No. 6,728,941 and entitled A METHOD OF MODELING THE CROSSOVER CURRENT COMPONENT IN SUBMICRON CMOS INTEGRATED CIRCUIT DESIGNS all of the aforementioned applications incorporated herewith by reference thereto.

FIELD OF THE INVENTION

The invention relates to the design of CMOS integrated circuits. In particular, the invention relates to automatic resizing of devices and selective substitution of low-threshold devices into CMOS circuits to optimize speed, circuit capacitance and power dissipation.

BACKGROUND OF THE INVENTION

Many CMOS processes involve threshold adjustment implant steps. These threshold adjustment implants typically involve masking operations, such that the N and P type device thresholds may be independently adjusted.

It is known that N-type devices having reduced thresholds may be fabricated by selectively blocking part of the N-type threshold adjustment implant while fabricating N type devices. Similarly, reduced threshold P-type devices may also be fabricated.

A particular example process provides transistors having gate lengths of about a tenth micron, nominal N-type threshold voltages of about 0.3V for a low threshold Reduced-Vt transistor, and about 0.35V for a normal threshold transistor. This process also provides P-type Reduced-Vt devices having a threshold of about −0.31V and normal threshold P-type devices having threshold voltage of about −0.365 V.

On the example process, saturation currents of the Reduced Vt devices tend to be about twenty percent higher than normal threshold devices.

Enhancement, Reduced-Vt, and intrinsic device types are often used together in the design of analog circuitry and special-purpose digital circuitry. For example, a Reduced-Vt device used as a source-follower offers slightly better headroom than an Enhancement device; and a Reduced-Vt device requires less bias voltage than an Enhancement device when used as a capacitor. An N-type Reduced-Vt device source-follower may also be used in parallel with the P-type pullup of a digital clock-driver.

Typical digital signal levels can not be guaranteed to completely turn off typical Reduced-Vt devices; in effect these devices leak more than their normal Vt counterparts. On the example process, device leakage of the Reduced Vt devices is about ten times higher than that of normal threshold devices, and may reach or exceed two microamps per micron of gate width at high temperatures. This can produce substantial leakage current if a large percentage of transistors on a large integrated circuit, such as a modern processor integrated circuit, are of the Reduced-Vt type.

Gates built of Reduced-Vt transistors can therefore be referred to as a fast-but-leaky gate type, and those of standard thresholds as slow-but-not-leaky gate type.

It is known that the effective source-drain resistance of a CMOS transistor used as a switching device in a logic gate is strongly dependent upon the difference between its gate-source voltage and its threshold voltage An N-type enhancement pulldown transistor having one volt gate-source will therefore conduct significantly less current than an N-Type Reduced-Vt device of the same size and having the same gate-source voltage. On an example process, this current may be twenty percent higher for Reduced-Vt devices than for normal devices. For this reason, Reduced-Vt devices have been used in speed-critical logic circuits where timing requirements can be met in no other way.

Threshold voltage can also be effectively increased, and leakage substantially reduced, by increasing device length, with consequence of increased gate capacitance and reduced IDSat (hence reduced speed). Even a small increase in length can substantially reduce leakage. A CMOS design may use gates with normal L's for speed where necessary, and gates with slightly greater L's where lower leakage is important. The normal L devices may also be termed a fast-but-leaky type and the greater L devices as slow-but-not-leaky type. For example, Transistors on a 0.1 u process could have 0.1 u L when high speed is needed, while they could be ten percent longer when lower leakage outweighs the speed disadvantage.

It is also known that effective threshold voltage of MOS transistors in logic circuits may be adjusted by applying substrate or well bias. Variation in threshold with substrate bias is known as the body effect. For n-channel transistors, the conventional substrate bias is 0V, and for p-channel transistors the conventional bias is the local power supply voltage VDD. If the N type bias is increased to a level above circuit ground, Vt can be reduced a little at the expense of increased junction capacitance. Similarly, if N type bias is decreased to a level below circuit ground, Vt can be effectively increased and junction capacitance decreased. P-channel transistors are similarly affected, although polarity is reversed.

Standard CMOS N-well processes lend themselves readily to application of bias to wells, and thereby to P-type transistors. Other processes may be adaptable to application of bias to N-type transistors. For purposes of this patent, devices having transistors with bias such that the absolute value of threshold voltage is reduced are also termed a fast-but-leaky type and devices with a bias such that the absolute value of threshold voltage is increase are termed a slow-but-not-leaky type.

Power dissipated in CMOS integrated circuits is often described as having a static component and a dynamic component. Static power includes power dissipated through junction and device leakage, power dissipated through resistive and current-source loads, and other power consumption that is not a function of switching activity.

Dynamic power includes power dissipated through charging and discharging capacitances, including gate capacitances, as well as crossover current dissipated during signal transitions at gate inputs. Crossover current includes current that passes from rail to rail through both the N-type and P-type stacks of a CMOS gate because both stacks are partially conductive during a transition of an input signal to the gate. Dynamic power is generally a function of parameters including the clock rate, the capacitance switched by devices, and the supply voltage.

Historically, the component of dynamic power associated with charging and discharging capacitances has been more significant than that associated with crossover current. This was because transistors in CMOS circuits historically transition from the off-state to the on-state and vice versa rather than transitioning between a partially-conductive state and the fully on-state. The component of dynamic power associated with crossover current has generally been ignored in the design of integrated circuits.

The component of dynamic power associated with charging and discharging capacitances is proportional to the product of capacitance times the charge and discharge rate times the square of the voltage. The activity ratio of each node is the ratio of the charge and discharge rate of the node to the clock rate. Dynamic power is therefore generally proportional to the product of clock rate times the activity ratio times node capacitance times the square of the power supply voltage.

The activity ratios of nodes of a processor or other large logic circuit vary with the design of the circuit, the position in the circuit of the nodes, and with the functional environment of the circuit. The activity ratios of different nodes in a circuit may vary substantially. The functional environment of the circuit includes, for processor circuits, code running on the processor.

The total power dissipated by a device includes both static power and dynamic power. Leakage in Reduced-Vt devices used in logic gates contributes to static power.

Much design of complex integrated circuits is accomplished through a design flow that begins with creation of a synthesizable register-transfer-level (RTL) description of the circuit. Synthesis tools, available from Cadence Design, Mentor Graphics, and Synopsys, among other vendors, map this RTL description into a gate-level netlist. Selected circuitry may also be synthesized manually through creation of gate-level schematics and extraction of the schematics to create a gate-level netlist. Static timing analysis software is then used to determine expected delays in a circuit, and to compare these delays with limits expressed in a "constraint file." Static timing analysis software is incorporated into many common synthesis tools and is also available as stand alone software from vendors including Synopsys, Mentor Graphics, and Avertec. Results of this preliminary timing analysis are often fed back to the synthesis tool, which substitutes faster gates, and may rearrange logic, as necessary to meet timing requirements.

Synthesized logic meeting pre-layout timing constraints is then laid out, or physically designed, often by place and route software such as that available from Cadence Design, Avant!, and Monterrey Systems. Layout-dependent capacitive loading and interconnect resistance information is then extracted from the physical design, and additional static timing analysis performed to verify that the circuit still meets timing requirements.

The universe of possible circuits for each path in an integrated circuit can be quite large. Each possible circuit has an associated power-delay product. It is known that there may be several local minima in the universe of power-delay products for each path. Some of these local minima may have lower power-delay products than others; it is desirable to find and implement the solution having the lowest power-delay product in the universe, this solution is the global minimum.

Existing timing-driven integrated circuit design software typically considers timing and power consumption separately. This may result in designs that dissipate considerably more power than that which would be required if the circuit were optimized for both power consumption and for timing because a local minima is found rather than the global minimum.

Conventional optimizers start with an initial condition and determine a search direction by examining a derivative of the power-delay product of the universe of solutions. It then "slides" down the power-delay product function in units of a predetermined step size to reach a minimum point. This minimum is likely to be a local minimum for many, but not all, initial conditions. The search performed by the optimizer is termed "greedy" if it only allows its search to proceed in a direction that appears from the derivative to lead to a more optimal member of the universe of solutions. A "greedy" search will stop when the optimizer has "slid" down to a local minimum. The optimizer may then report that local minimum as the best solution found, often without climbing a "hill" from which a better minimum can be found; a condition termed "stuck in a local minimum".

Greedy optimization is typically fast but tends to stick in a local minimum. Optimizers of this type can be termed local optimizers, since they find the nearest local minimum. Greedy optimizers therefore require good initial solutions "near" the optimal solution; initial solutions that can be difficult to provide.

Global optimizers have an ability to find global minima, as opposed to local minima. Some optimizers used in computer-aided design (CAD) for integrated circuits, including placers and routers, use a process called "simulated annealing." In simulated annealing, an initial state is randomly mutated into a successor state. The successor state is evaluated, and the evaluation result is compared against the initial state. In general, successor states replace the initial state for following iterations if they are determined to be an improvement on the initial state.

Some "hill-climbing" simulated annealing optimizers allow for occasional retention of state evaluated as inferior to the initial (or parent) state. Typically, simulated annealing has a "temperature" parameter that controls the amount of change made between the initial state and each successor state. With a hill-climbing optimizer, this temperature also controls the likelihood that an inferior state will be retained as the parent state for further iterations. This temperature is gradually reduced as optimization proceeds.

Genetic optimizers are global optimizers employing algorithms that are modeled on the process of evolution in nature. Typically, genetic algorithms operate by creating a population of individual variations, or mutations, from at least one parent individual. Each individual is a proposed solution to a particular problem. Each individual is typically represented as a machine representation having a particular state.

Individuals of the population may be created by mutating a parent, or by crossing portions from several parents. These algorithms then undergo a selection process, where individuals of the population are scored and those individuals determined to be better than most of the population are retained, while the remainder are deleted. The retained individuals may be used as parents in further iterations.

After one or more generations of the population, a particular "best" individual is selected as an optimized solution to the problem being solved.

Simulated annealing optimizers typically create a single mutated state at each iteration, the mutated state being derived by modifying a single parent state. Genetic optimizers typically create a population having more than one individual mutated state at each iteration. Genetic optimizers also often create individual mutated states of the population through crossover operations from more than one parent state.

It is desirable to reduce the overall power dissipated in an integrated circuit. It is also necessary to ensure that circuit timing requirements are met. The invention as described below helps the design engineer to achieve these goals.

SUMMARY

It has been found that predicted total power dissipation and circuit speed of an integrated circuit can be optimized by automatically resizing devices and selectively substituting fast-but-leaky devices for normal devices.

The activity ratio of each gate is determined by logging activity of each node during logic simulations of the design. For particular embodiments involving processor integrated circuits, logic simulations are performed while simulating execution of benchmark programs similar to those expected to be run by typical users.

Candidate devices for optimization are identified by inspection of a netlist of the integrated circuit. These candidate devices may, but need not, be on critical paths of the circuit. In particular embodiments, it has been found beneficial to include in optimization both devices on and off the critical paths of the circuit.

The netlist may be a pre-layout netlist with expected interconnect resistance and capacitance, or a post-preliminary-layout netlist with extracted interconnect resistance and capacitances. Optimization may be performed on both.

Global optimization is performed. This involves candidate devices being substituted with fast-but-leaky devices and/or gates of altered size. Substitutions are evaluated for total power and speed. Total power includes static power dissipated by fast-but-leaky devices as well as dynamic power.

In a particular embodiment, a genetic optimization method is used to optimize sections of an integrated circuit design for power consumption and for circuit speed in the same genetic optimization. In this embodiment, both size and gate type substitutions may be made at one or more points in the circuit to create each individual of the population; individuals are scored for both power dissipation and speed at each iteration. The genetic optimization adjusts both device types and sizes at multiple locations in a circuit to produce well-optimized final circuit designs.

After the global optimization, an additional stage of greedy optimization is performed on selected optimized circuit partition variants as produced by the genetic optimization. The best performing optimized circuit partition variant is selected for use in the optimized integrated circuit.

DETAILED DESCRIPTION OF THE EMBODIMENTS

Figures 1, 3:
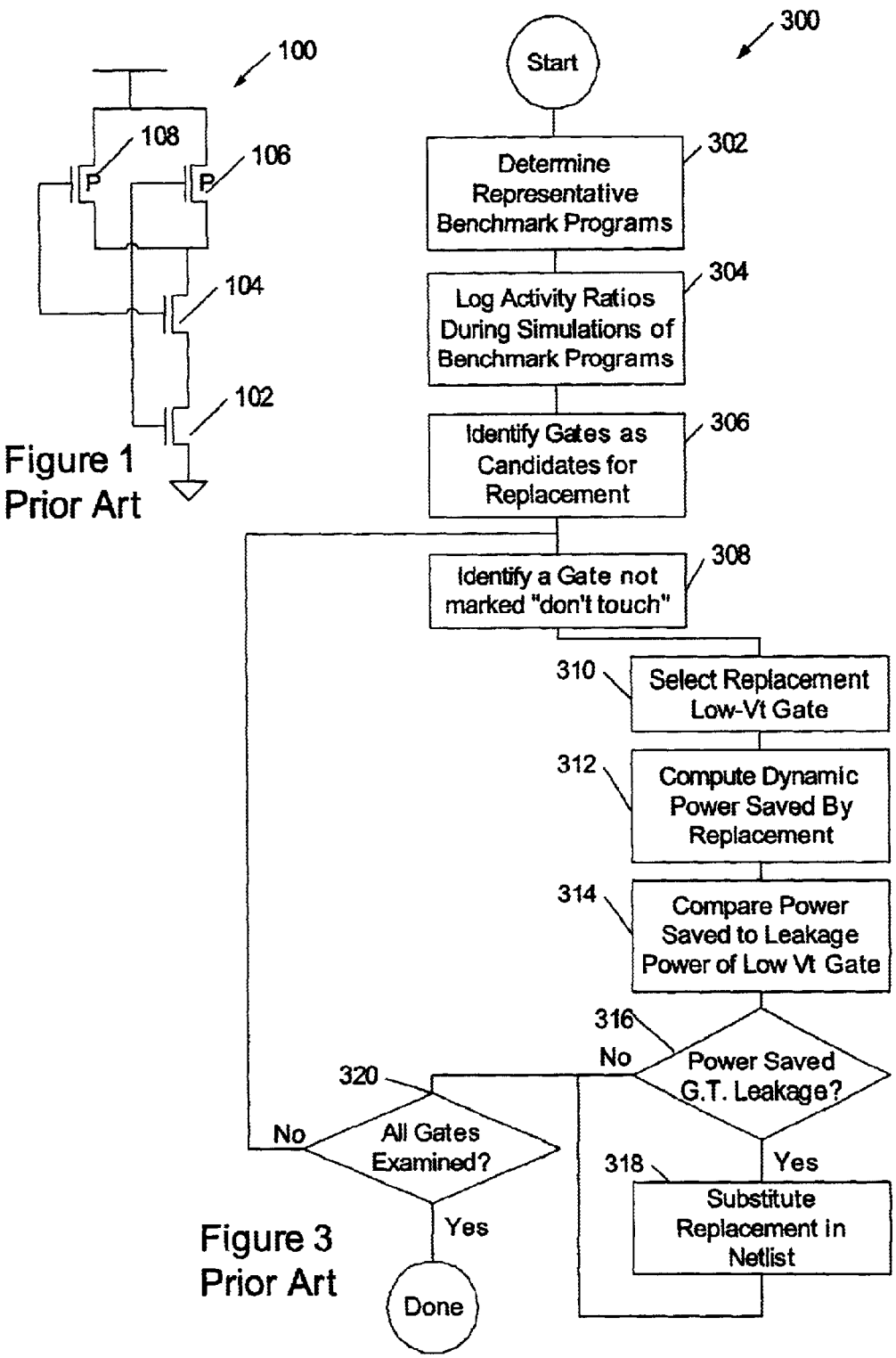
FIG. 1 is a schematic of a typical prior-art CMOS logical NAND gate.
FIG. 3, a flowchart of a method of reducing power consumption in an integrated circuit design.

A typical CMOS NAND gate 100 (FIG. 1) has a first pulldown transistor 102 in series with a second pulldown transistor 104. There is a first pullup transistor 106 and a second pullup transistor 108.

Simple gates such as the NAND gate illustrated in FIG. 1, NOR gates (not shown), and Inverters (not shown) are known to have gate capacitance proportional to their device sizes. Large device sizes have large gate capacitance, while small device sizes have small gate capacitance. These simple gates also are capable of driving load capacitances in a time that varies inversely with the device sizes. For the same load capacitance, gates having large device sizes will drive large loads faster than gates having small device sizes.

It is also known that, for the same device size and gate structure, gates built of Reduced-Vt transistors drive load capacitances faster than gates built of standard-threshold devices. Such gates built of Reduced-Vt transistors are also known to leak more than standard-threshold gates; such leakage may be a significant contributor to static power consumption. Reduced-Vt devices can be referred to as fast-but-leaky and standard-threshold devices as slow-but-not-leaky.

Figure 2:
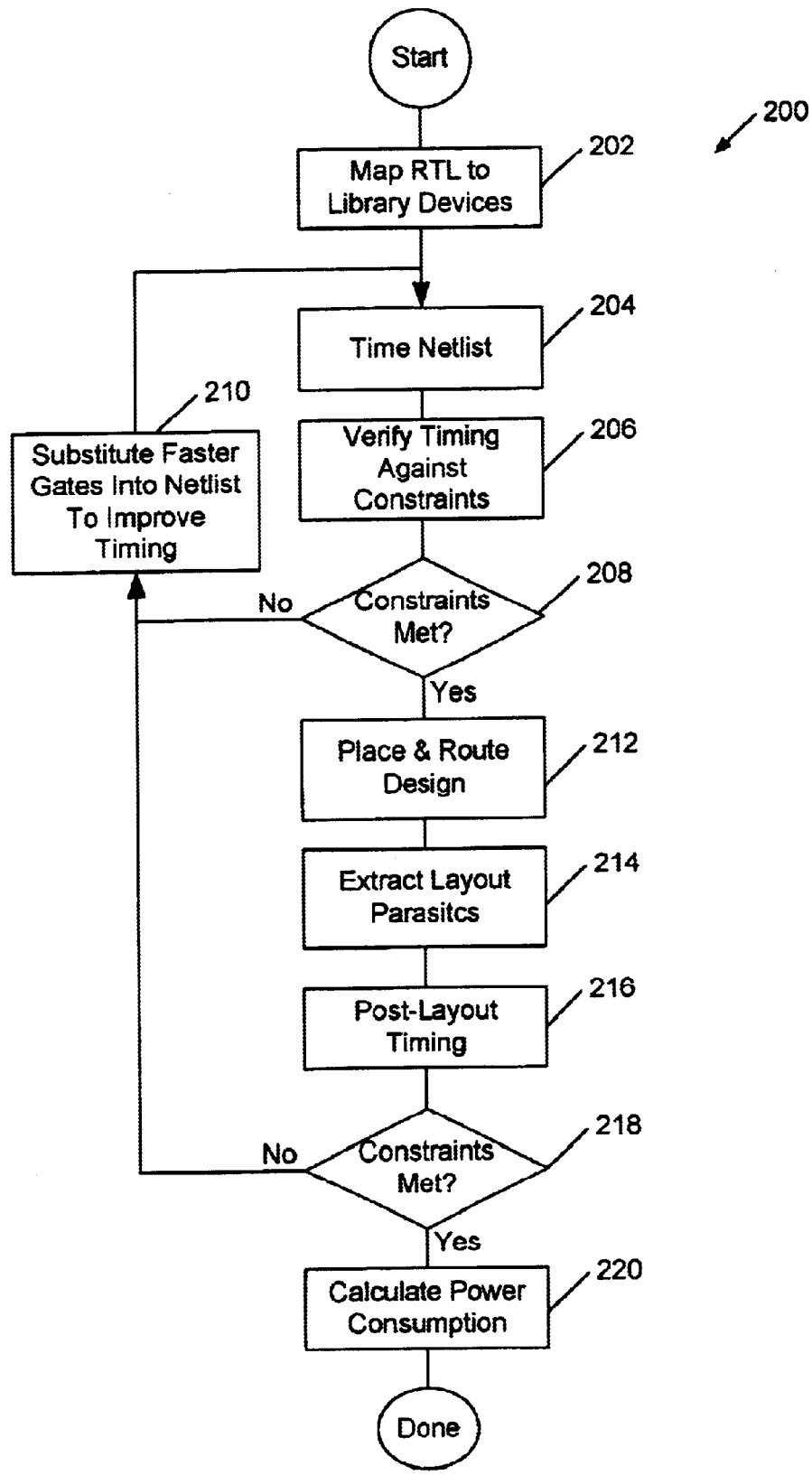
FIG. 2, a prior-art design flow for designing CMOS integrated circuits.

During a prior-art design flow 200 (FIG. 2) of a CMOS integrated circuit such as may embody the gate of FIG. 1, a register-transfer-level (RTL) description of circuit function may be created. This RTL description is fed to a synthesis tool, which maps 202 the RTL description into a gate level netlist. The gate level netlist fed to a static timing analyzer, commonly part of the synthesis tool, which times 204 the design by calculating expected delay for each gate in the netlist. The expected delay is based upon factors including transistor size of each gate, fanout, expected wiring capacitance, and load gate capacitance.

Delays of paths through the netlist are then totaled and verified 206 against timing constraints set by the designer. If 208 the timing constraints are not satisfied, gates on failing paths are often substituted 210 with faster gates, typically constructed of transistors of larger size or of low-Vt transistors, and timing is re-verified 206 to ensure that the constraints are met. Some synthesis tools can also restructure the gate level netlist to reduce the number of logic stages on critical paths to help meet timing.

Once the timing constraints are satisfied, physical design of the integrated circuit is performed. Physical design is often done by automatically placing and routing 212 physical gates in a layout. Since the layout may have interconnect capacitance that may differ considerably from that expected before layout, parasitic capacitances, and often parasitic resistances, are extracted 214 from the layout and post-layout timing 216 delay is calculated for each gate in the netlist. This post-layout delay is summed for each path and verified 218 against the timing constraints.

Finally, power consumption may be calculated 220 by summing parasitic and gate capacitances of the circuit, multiplying by the square of the operating voltage, multiplying by operating frequency, and multiplying by an activity factor.

In another prior-art design flow 300 (FIG. 3), a timed, gate-level netlist of an integrated circuit, is optimized to reduce total power dissipation. For processor integrated circuits, a set of benchmark programs 302 is selected that is expected to have characteristics similar to programs used by typical buyers of the integrated circuit. For peripheral device integrated circuits, a test program set is developed that is expected to exercise nodes of the integrated circuit similarly to the way nodes will be exercised in actual use. The netlist is logically simulated while running the benchmark or test programs, while activity ratios are logged 304 for each gate of the netlist.

Next, gates are identified 306 by a program running on a computer as targets for substitution. Identification may be based upon gate size. For each individual gate 308, the program selects 310 a candidate replacement gate built of Reduced-Vt transistors of relatively small size. The candidate replacement is selected to have equivalent speed to the original gate. Since the candidate replacement gate has smaller device sizes, it has less gate capacitance than the original gate. The activity ratio for the gate, as logged previously 304, is used to calculate 312 a savings in dynamic power achieved by the substitution. This savings in dynamic power occurs because the Reduced-Vt gate can have smaller device sizes while producing equivalent drive; smaller device sizes have smaller capacitance so the component of dynamic power associated with charging and discharging capacitance is reduced.

This savings in dynamic power is compared 314 against the static power expected as a consequence of leakage in the Reduced-Vt gate. If 316 the dynamic power saved is greater than the leakage power, the candidate replacement gate is substituted 318 into the netlist. The program repeats 320 this process until all candidate gates not marked as "don't touch" have been checked for possible substitution.

In an embodiment of the present optimizer 400 (FIG. 4), optimization is performed for both power dissipation and speed by a high-speed digital computer. The netlist is partitioned 402 into sections that include at least one path from clock to clock in each section. For each partition, a machine representation of an initial parent state is created 404 for optimization. A population of individual states is created 406 from the parent state by performing mutation and crossover operations.

Each state in the population includes size and type of those gates present in the at least one path. Mutation involves substitution of gates of different size, or replacement of slow-but-not-leaky gates with fast-but-leaky gates, or replacement of fast-but-leaky gates with slow-but-not-leaky gates. Crossover operations involve exchanging portions of a parent state with another parent state, thereby creating a new individual state having some gate sizes and types from one parent state and some gate sizes and types from the other parent state. In an initial embodiment, the slow-but-not-leaky gates have standard-Vt transistors, while the fast-but-leaky gates are built of Reduced-Vt transistors.

In another embodiment, the slow-but-not-leaky gates have transistors having a slightly greater than minimum device L, while the fast-but-leaky gates are built of transistors having minimum device L. In a variant to this embodiment, there are three device types that may be exchanged during the optimization, a fast-but-leaky gate type built of Reduced-Vt transistors with minimum L, a normal gate type built of standard-Vt transistors with minimum L, and a slow-but-not-leaky gate type built of standard-Vt transistors with device L of about ten percent greater than minimum.

In particular, slow-but-not-leaky gate types may be built having transistors with device L of between five and twenty percent greater than the normal minimum rule for the process.

The present optimization approach will also work with a fast-but-leaky device type and a slow-but-not-leaky device type differentiated by having different bias voltages applied to some of their transistors.

States in the population are known as chromosomes, each chromosome has a gate-type gene and a gate-size gene for each gate in the path. Gate sizes and types are selected from those gate sizes and types available in a cell library of predefined cells.

Each state in the population is then scored 408 for timing and for power dissipation. Delay for each path from clock to clock in the partition is calculated, and each delay total is compared to timing constraints. If any path exceeds timing constraints, the score for the individual is negatively affected. Power dissipation is computed based on activity ratios for each gate that were logged during simulation of benchmark programs as previously discussed 304. The score for the individual is affected inversely to power dissipation.

Individual states from the population are selected 410 for survival based upon their score. Those states having the best score are guaranteed survival; those having lower scores are granted a lower, but finite, probability of survival. Individual states having poor scores are granted a chance of survival to ensure that the algorithm can converge on global optima for the partition, and not become stuck in local optima.

If 412 timing constraints were not met, the surviving individuals are retained as parents and a new population of individuals is created 406 from them. Similarly, if 414 an iteration limit is not exceeded, the surviving individuals are retained as parents and a new population of individuals is created 406 from them. Once the iteration limit is reached, the best surviving individual is selected 416, and the optimization process is repeated 418 for any remaining partitions that still need optimization.

The netlist is updated with information from the best surviving individual as each partition is optimized.

Figure 5:
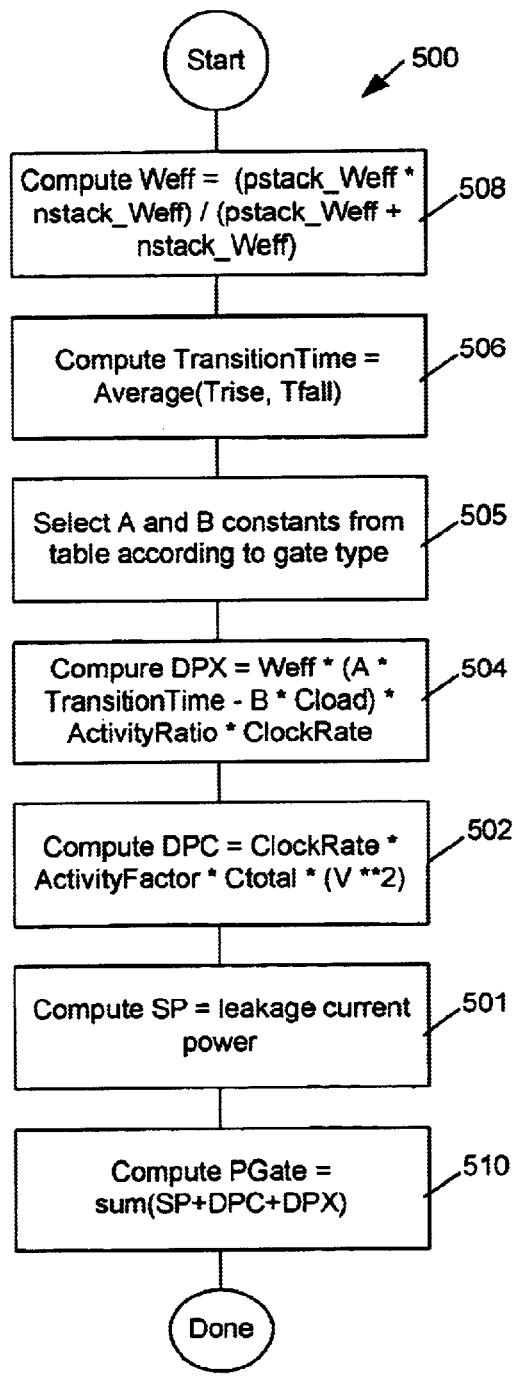
FIG. 5, a flowchart illustrating computation of power dissipation including a crossover current term.

During scoring 408, power dissipation is calculated 500 (FIG. 5) for each individual, static power SP associated with device leakage is calculated 501 for each gate in the partition. This is done by multiplying the expected leakage current for the gate by the square of the operating voltage.

A capacitance-related dynamic power DPC component is computed 502 based upon capacitance of devices and interconnect (Ctotal), the clock rate (ClockRate), the operating voltage squared ($V^{**}2$), and the activity factor (ActivityFactor).

$$DPC = ClockRate * ActivityFactor * Ctotal * (V^{**}2)$$

It has been found that accuracy is greatly enhanced for deep-submicron processes if a crossover-related dynamic power component DPX is computed 504 as:

$$DPX = Weff * (A * TransitionTime - B * Cload) * ActivityRatio * ClockRate;$$

where A and B are process, operating voltage, and device-type dependent coefficients. For an example process and operating voltage, A=0.12 and B=0.019 for normal Vt gates and A=0.27 and B=0.0345 for Reduced-Vt gates. A and B are characterization constants derived from circuit simulation of example gates of each threshold voltage or leakage type on the process in use. A and B are maintained in a table and selected 505 for use in the computation according to the threshold voltage or leakage type of each gate. Cload is a total load capacitance, including interconnect capacitance and fanout device load, of the gate for which power consumption is being calculated.

The TransitionTime term is calculated 506 as an average of the rise and fall times expected on the inputs of the gate. Weff is calculated 508 as an effective composite transistor width calculated as:

$$\text{Weff} = \frac{\text{pstack\_Weff} * \text{nstack\_Weff}}{\text{pstack\_Weff} + \text{nstack\_Weff}}$$

where pstack_Weff is an effective total width for the P-type devices in the gate, and nstack_Weff is an effective total width for the N-type devices in the gate.

Total power for each gate (PGate) is then calculated 510 as:

$$P\text{Gate}=\text{sum}(SP+DPC+DPX)$$

The effective width nstack_Weff or pstack_Weff for a switching branch comprising transistors in series is calculated as:

$$\text{stack\_Weff}=1/((1/W1)+(1/W2)+\ldots+(1/Wn))$$

The effective width for a switching branch consisting of transistors in parallel is calculated as the sum of the widths of all the switching transistors. Series-parallel configurations are common in complex logic structures, including AND-OR-INVERT gates. For these structures, effective stack_Weff is calculated by combining these equations.

Total power for a partition is then computed by summing the total power for each gate in the partition.

A first alternative embodiment is of particular utility where the netlist is primarily a netlist of individual transistors rather than of characterized standard gate cells. In this embodiment, the optimization process proceeds in similar manner to that discussed with reference to FIG. 4, except that there are a transistor V-type gene and a transistor size gene for each individual transistor, instead of a gate Vt-type and gate size. Substitution is therefore performed on a per-transistor basis instead of as previously discussed on a per-gate basis. Timing analysis for each path of a partition is performed as known in the art.

It has been found that the genetic optimization described with reference to FIG. 4 has a good chance of finding a global minimum, but takes multiple iterations to converge on the minimum solution.

Figures 6, 9:
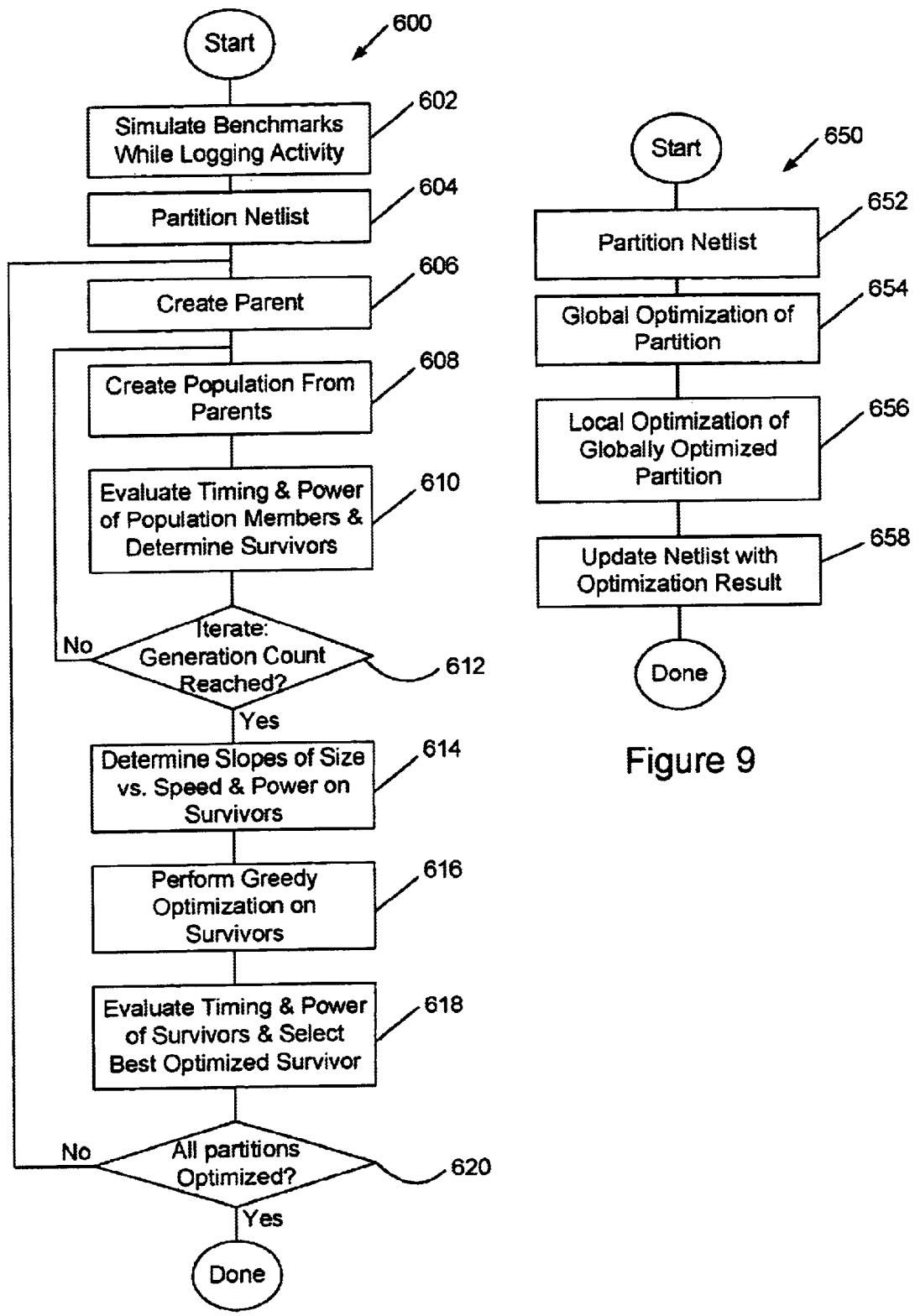
FIG. 6, a flowchart illustrating optimization by both genetic and greedy optimization.
FIG. 9, a simplified flowchart illustrating optimization by both genetic and greedy optimization.

Another alternative embodiment 600 (FIG. 6) therefore combines genetic optimization with a greedy optimization. In greatly simplified form, this embodiment 650 (FIG. 9) involves partitioning the netlist 652, performing global optimization 654 of each partition or of the netlist as a whole if partitioning if the netlist is small enough to handle without partitioning, and performing local optimization 656 on selected survivor results of the global optimization. The netlist is then updated 658 with the best result of the combined optimization.

In this embodiment, (FIG. 6), logic simulations, typically of benchmark programs, are instrumented to log activity ratios 602 of circuit nodes as heretofore discussed. The netlist is then partitioned 604 into independently optimizable partitions as heretofore discussed.

Figure 4:
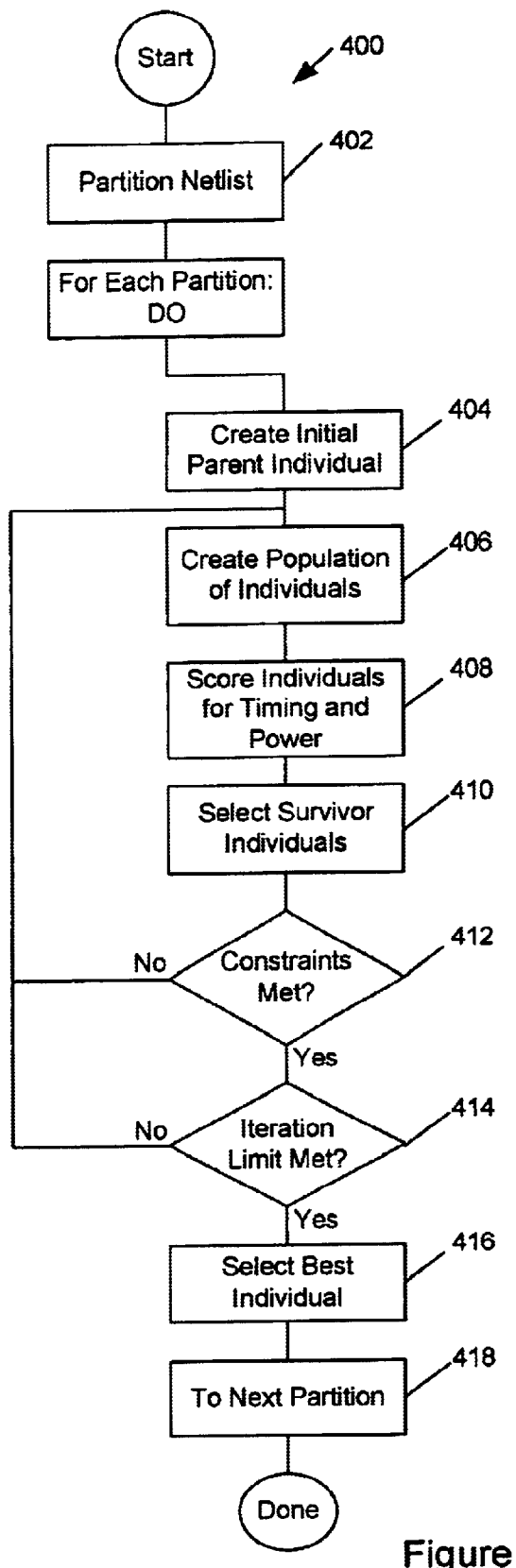
FIG. 4, a flowchart of a genetic optimization method for optimizing timing and power consumption together in an integrated circuit design.

The genetic optimization proceeds similarly to that previously discussed, however fewer generations, or iterations, are required than with the method of FIG. 4. For each partition, a machine representation of an initial parent state is created 606. A population of states is created 608 from at least one parent state, and each individual of the population is evaluated or scored 610 to determine a score. The probability of survival of individuals in the population depends on this score. Surviving individuals become parents in further generations as the optimization iterates 612.

When an iteration count is reached, surviving individuals are further optimized with a greedy optimization. This begins by determining 614 slopes of the gate size vs. speed and power functions. A search direction is determined from the slopes, and gate sizes are adjusted 616 in the direction of better combined power and speed performance. Adjustment continues until a further step results in degraded power and speed performance. The optimized survivors are then evaluated 618 for power and speed performance and the best solution found selected for installation in the netlist.

The optimization is iterated 620 for each partition of the netlist until all partitions have been optimized. It has been found that this combination of global and local optimization is particularly effective at producing optimal designs.

The present optimization methods are applicable both before layout, and after layout. For example, pre-layout estimates of interconnect resistance and capacitance, typically based upon gate fanout, can be used with the present optimization method to produce a best guess of an optimum netlist. After initial layout, the optimization is repeated using extracted interconnect resistances and capacitances in timing and power computations. Changes made to the netlist during optimization are also made in the layout, and a final layout is generated. The final layout is re-extracted and final timing is verified.

Figure 7:
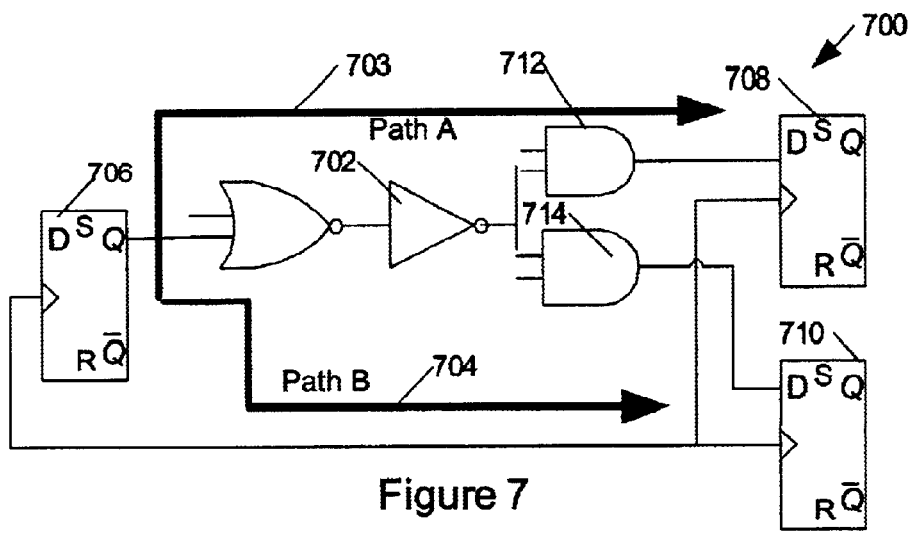
FIG. 7, an illustration of logic within a partition of a hypothetical integrated circuit.

Consider logic 700 (FIG. 7) such as may be in a partition of a netlist. A gate, such as inverter 702, may form part of more than one path of interest for timing analysis. For example, inverter 702 forms part of path A 703 from Q output of D-flop 706 to the D-input of D-flop 708, and part of path B 704 from D-flop 706 to the D-input of D-flop 710. Gate 712 is part of Path A, and Gate 714 is part of Path B.

Assume Path A 703 is a critical path of the circuit. Path B 704, which shares inverter 702 with Path A 703, may, but need not, also be a critical path. Note that in this particular example, gate 714 of Path B 704 is a load on inverter 702; size and gate type changes at gate 714 therefore have potential to affect timing of Path A 703. It has been found advantageous during partitioning 402, 604 to include all branches of a critical path in the same partition, that is then subjected to optimization on all elements of the partition. Gate 714 is therefore included in the partition used for optimization of Path A 703, and Gate 714 may be altered in size and type during the steps of creation of a population of individuals 406, 608.

Figure 8:
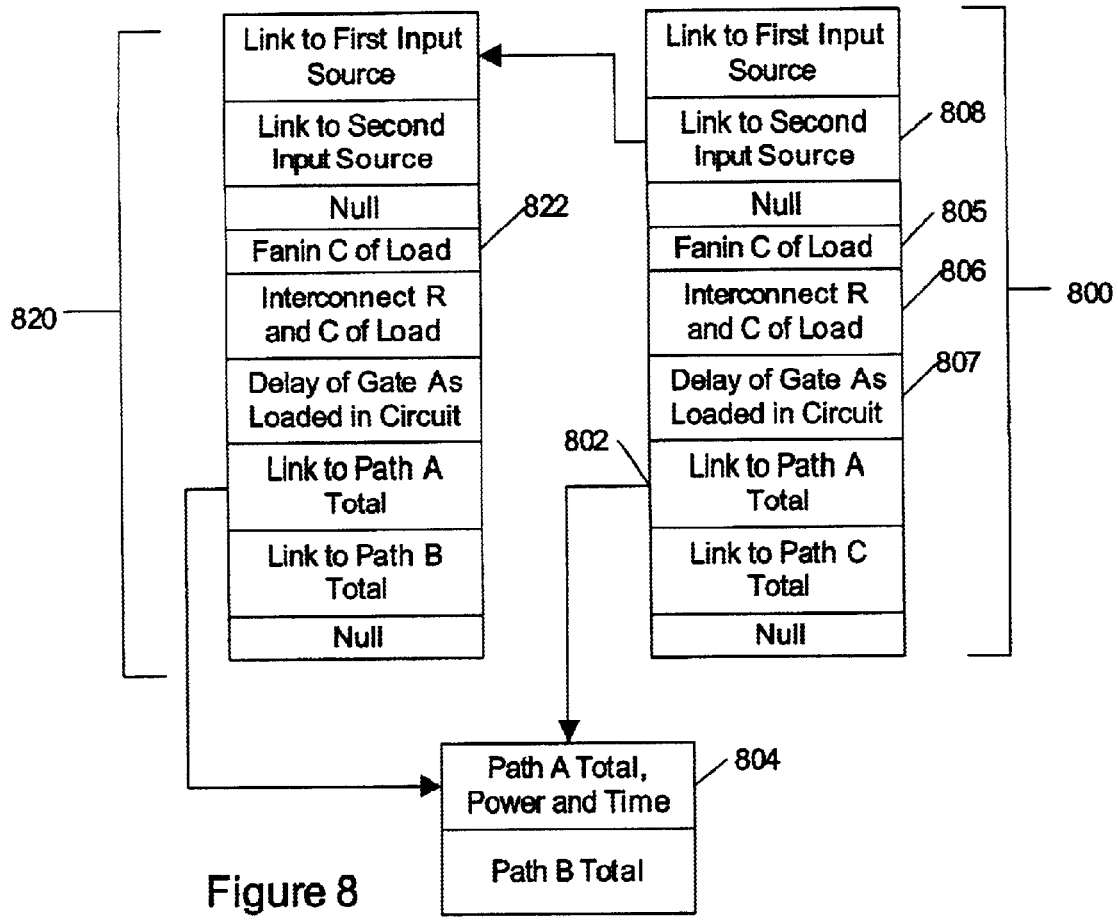
FIG. 8, an illustration of a data structure permitting fast genetic optimization.

In another alternative embodiment, a machine representation of a partition 799 is created including a data structure, such as data structure 800 (FIG. 8) for each gate, such as gate 712. The data structure includes pointers, such as path A total pointer 802, to path totals, such as a path A total 804 of delay and power dissipation associated with each path through the gate. The data structure also includes information with which delay of a substituted gate can be rapidly calculated, including load capacitance 805 and interconnect RC 806.

As each individual state is created, the effect of substitutions on delay of the substituted gate may be quickly and efficiently calculated by applying the load capacitance 805 and interconnect RC 806 to a characterized model associated with the substituted gate. The difference between the new delay and an old delay 807 is rapidly calculated, and applied to copies of the totals, such as total 804. Power totals can also be quickly and rapidly updated.

The data structure also includes one or more reverse links, such as reverse link 808, that links to a similar structure associated with each gate, such as inverter 702, that drives the gate 712 associated with structure 800. This permits rapid identification of driving gates, whose timing and power consumption may be affected by the substitution. The reverse link 808 is followed to the structure, such as structure 820, associated with each driving gate. The load capacitance 822 of the structure 820 associated with the driving gate is adjusted according to differences in input capacitance of the original and substitute gates, and timing and power changes are applied to the individual-specific copies of the totals 804.

A computer program product is any machine-readable media, such as an EPROM, ROM, RAM, DRAM, disk memory, or tape, having recorded on it computer readable code that, when read by and executed on a computer, instructs that computer to perform a particular function or sequence of functions.

While the invention has been particularly shown and described with reference to particular embodiments thereof, it will be understood by those skilled in the art that various other changes in the form and details may be made without departing from the spirit and scope of the invention. It is to be understood that various changes may be made in adapting the invention to different embodiments without departing from the broader inventive concepts disclosed herein and comprehended by the claims that follow.

What is claimed is:

1. A method of optimizing speed and predicted power consumption of a design for an integrated circuit, the design for an integrated circuit comprising at least one path further comprising at least one gate, the method comprising the steps of:

creating a machine representation of a parent state representing at least some devices of the integrated circuit design, where for each device in a path of the integrated circuit the parent state further comprises device size information;

creating a population of individual states from at least one parent state;

scoring individual states of the population for timing and power dissipation to create a score for each individual state;

selecting survivor individual states of the population based upon their scores;

iterating the steps of creating a population, scoring individual states, and selecting survivor individual states, where the survivor individual states of each iteration become parent states of the next iteration;

determining, for at least one device of at least one survivor state, slopes of speed and power consumption as affected by device size;

adjusting device sizes of at least one survivor state according to the determined slopes; and selecting a best individual survivor state as an optimized state and updating an integrated circuit netlist therefrom.

2. The method of claim 1, wherein the parent state further comprises device type information, where the device type information further comprises selection between at least one fast-but-leaky type and at least one slow-but-not-leaky type.

3. The method of claim 2, further comprising the step of logging activity ratios from a logic simulation of the integrated circuit, and wherein the step of scoring uses logged activity rations to calculate power dissipation.

4. The method of claim 3, wherein a difference between at least one fast-but-leaky type and at least one slow-but-not-leaky type is an implant dose such that the threshold voltages of transistors used in the fast-but-leaky type differ from the threshold voltages of transistors used in the slow-but-not-leaky type.

5. The method of claim 2, wherein a difference between at least one fast-but-leaky type and at least one slow-but-not-leaky type is the length of transistors.

6. The method of claim 2, wherein a difference between at least one fast-but-leaky type and at least one slow-but-not-leaky type is a bias voltage applied to transistors.

7. The method of claim 2, wherein the step of scoring individual states of the population for timing and power dissipation to create a score for each individual state includes calculating a crossover current component for a plurality of gates of the design.

8. The method of claim 7, wherein the crossover current component is computed by steps comprising:

computing an effective width for the gate;

determining a transition time at an input of the gate;

determining a load capacitance at an output of the gate;

determining an activity ratio of the gate; and multiplying the effective width by the activity ratio, a clock rate, and the difference of a first constant multiplied by the transition time and a second constant multiplied by the load capacitance to determine a crossover current component of dynamic power of the gate.

* * * * *